United States Patent [19]

Katoh

[11] Patent Number: 5,789,967
[45] Date of Patent: Aug. 4, 1998

[54] SEMICONDUCTOR DEVICE WITH BOOST VOLTAGE SUPPLY MEANS

[75] Inventor: Yoshiyuki Katoh, Tokyo, Japan

[73] Assignee: NEC Corporation, Japan

[21] Appl. No.: 625,916

[22] Filed: Apr. 1, 1996

[30] Foreign Application Priority Data

Mar. 31, 1995 [JP] Japan ................... 7-075135

[51] Int. Cl.$^6$ ................................... H03K 17/693
[52] U.S. Cl. .................. 327/408; 327/534; 327/407
[58] Field of Search ................... 327/52, 55, 407, 327/408, 534, 535

[56] References Cited

U.S. PATENT DOCUMENTS

| | | | |
|---|---|---|---|
| 4,616,148 | 10/1986 | Ochii et al. | 327/55 |
| 4,973,864 | 11/1990 | Nogami | 327/55 |
| 5,055,705 | 10/1991 | Hall | 327/408 |
| 5,270,583 | 12/1993 | Miyawaki et al. | 327/534 |
| 5,305,269 | 4/1994 | Vinal | 327/55 |
| 5,525,926 | 6/1996 | Merritt | 327/535 |
| 5,600,277 | 2/1997 | Koelling | 327/408 |

*Primary Examiner*—Terry Cunningham
*Attorney, Agent, or Firm*—Hayes, Soloway, Hennessey, Grossman, Hage, P.C.

[57] ABSTRACT

A boost subject circuit block selector supplies a supply voltage to a corresponding boost voltage transmission line when a block selecting signal is at non-selecting level, while supplying a boost voltage from a boost voltage generator when the block selecting signal is at a selecting level. The boost subject circuit block selector includes a transistor, which is turned on in response to the transition of the block selecting signal to selecting level so as to supply the boost voltage to the boost voltage transmission line, and a transistor, which is turned on in response to the transition of the block selecting signal to the non-selecting level so as to supply the supply voltage to the boost voltage transmission line.

3 Claims, 5 Drawing Sheets

SEMICONDUCTOR DEVICE WITH BOOST VOLTAGE SUPPLY MEANS

FIELD OF THE INVENTION

1. Background of the Invention

The present invention relates to semiconductor devices and, more particularly, to semiconductor devices with boost voltage supply means for supplying boost source voltage to internal circuits at a predetermined timing.

2. Brief Description of the Related Prior Art

In recently fabricated semiconductor memories and like semiconductor devices, the operating source voltage (hereinafter referred to as operating voltage) is usually 5.0 V±10%, and it is 3.0 V±10%, 3.3 V±10%, etc. in lower operating voltage products. For lower operating voltage products, a boost technique for boosting word line voltage, for instance, so as to be higher than the source voltage, has been proposed. Boosting the word line voltage in lower operating voltage products increases voltage transfer line capacity of the memory cell transfer transistor, thus increasing the memory cell write data level and improving memory cell stability.

Where this boosting technique is employed, power consumption of the semiconductor device as a whole is increased. To suppress consumption current, use has been made of a method which uses a boosting circuit for each of a plurality of blocks into which the whole memory cell array is divided (the boosting circuit being hereinafter referred to as boost block selecting circuit). The division of the memory cell array into a plurality of blocks permits reduction in parasitic capacitance of the boosting circuit so that higher boost voltage can be obtained.

A typical example of a semiconductor device with such boost voltage supply means is shown in FIG. 6.

The illustrated semiconductor device comprises a boost voltage generator 1, which includes a boost capacitor C11, a pre-charger 12 for pre-charging the output terminal side of the boost capacitor C11 to the supply voltage Vcc and a boost driver 11 for driving the input terminal side of the boost capacitor C11 to the source voltage Vcc in accordance with a control signal BD, and generates a boost voltage Vbst which is higher than the supply voltage Vcc and is at a predetermined timing, a boost block selecting circuit 2x, which includes an n-channel transistor Q21 for receiving a block selecting signal BKS at the gate and having the source connected to ground potential, an n-channel transistor Q22 for receiving the source voltage Vcc at the gate and receiving the block selecting signal BKS at its source, a p-channel transistor Q23 for receiving the boost voltage Vbst from the boost voltage generator 1 at its source and substrate, having its drain connected to the drain of the transistor Q22 and its gate connected to the drain of the transistor Q21, and a p-channel transistor Q24 for receiving the boost voltage Vbst at its source and substrate, having its drain connected to the drain of the transistor Q21 and its gate connected to the drain of the transistor Q22, and for supplying the boost voltage Vbst to a boost voltage transmission line BTL when the block selecting signal BKS is brought to a selecting level (i.e., a low level), and a boost subject circuit block 3 including a word driver 3j (j being from 1 to m) for supplying the boost voltage on the boost voltage transmission line BTL to a corresponding word line WLj when a word line selecting signal WSj is brought to selecting level (i.e., low level). As noted above, a plurality of boost subject circuit blocks 3 are provided, and the boost block selecting circuit 2x and boost voltage transmission line BTL are provided for each of the boost subject circuit blocks.

The operation of the boost block selecting circuit 2x will now be described.

When the block selecting signal BKS is brought to the non-selecting level, i.e. high level, the transistor Q21 is turned on so as to bring the boost voltage transmission line BTL to ground potential. The transistor Q23 is turned on so as to bring the gate of the transistor Q24 to high level, thus turning off transistor Q24. Thus, the boost voltage transmission line BTL is brought to ground potential.

When the block selecting signal BKS is brought to the selecting level, i.e., low level, the transistor Q22 is normally turned on so as to bring the potential on the gate of the transistor Q22 to low level so as to turn on the transistor Q24. In the meantime, the transistor Q21 is turned off so as to raise the potential on the boost voltage transmission line BTL to the boost voltage Vbst, thus turning off the transistor Q23. The potential on the gate of the transistor Q24 is thus brought to low level so as to provide the boost voltage Vbst to the boost voltage transmission line BTL. At this time, upon appearance of the selecting level on the word selecting signal line WS, the corresponding word line is brought to the selecting level to select the boost voltage Vbst.

Now the ratio of the boost voltage Vbst to the source voltage Vcc, i.e., the boost ratio, in this semiconductor device will be described. The boost ratio is an increment of the voltage supplied to the boost voltage transmission line. FIG. 7 is an equivalent circuit diagram for explaining the boost ratio. Referring to FIG. 7, Node N1 is the input terminal of the boost capacitor C11, and node N2 is the output terminal of the capacitor C11 i.e., the output terminal of the boost voltage generating circuit 1, and also the input terminal of the boost block selecting circuit 2x. Node N3 is the boost voltage transmission line BTL connected to the output terminal of the boost block selecting circuit 2x. Labeled Cs is the total parasitic capacitance of the boost voltage transmission line BTL.

Denoting the voltages at the nodes N1 to N3 before boosting (when the transistor Q24 is "on") by:

$$VN1=0 \text{ V}, VN2=Vcc \text{ and } VN3=Va \tag{1}$$

and denoting the voltages at the nodes N1 to N3 after boosting (when the transistor Q24 is "on") are $$VN1=Vcc, VN2=Vcc+\alpha, \text{ and } VN3=Vcc+\alpha \tag{2}$$

since the charge is unchanged (i.e., preserved) irrespective of boosting, $$(Vcc-0)C11+VaCs=(Vcc+\alpha-Vcc)C11+(Vcc+\alpha)Cs \tag{3}$$

where C11 is the capacitance of the boost capacitor C11, and Cs is the parasitic capacitance. In this equation, the left side represents the charge before boosting, and the right side represents the charge after boosting. The equation (3) may be rearranged to:

$$\alpha=[Vcc(C11-Cs)+VaCs]/(C11-Cs) \tag{4}$$

where $\alpha$ is the increment of voltage supplied to the boost voltage transmission line BTL and represents the boost ratio. In boost techniques, this boost ratio is a judgment criterion of the effectiveness of the circuit. In the semiconductor device shown in FIG. 6, when the block selecting signal BKS is at the non-selecting level, the boost voltage transmission line BTL is at ground potential, and Va=0.

In this prior art semiconductor device, the boost voltage transmission line BTL is at ground potential when the block selecting signal BKS is at the non-selecting level, and is at boost voltage higher than the supply voltage (by factor+α) when at the selecting level. The device, therefore, has drawbacks in that its operation at the time of switching between the selecting and non-selection is slow due to long charging/discharging times and in that much power is consumed for charging and discharging, and further it has a problem in that the boost ratio can not be increased because of large potential amplitude at the time of switching from the non-selected state to the selected state.

SUMMARY OF THE INVENTION

An object of the present invention is therefore to provide a semiconductor device which exhibits faster operation and reduction in consumed power while also exhibiting increased boost ratio.

According to the present invention, there is provided a semiconductor device comprising: a boost voltage generator for generating a boost voltage higher than a source voltage at a predetermined timing, a boost subject circuit block for supplying the boost voltage from the boost voltage generator to a predetermined internal circuit at a predetermined timing, a boost voltage transmission line provided for the boost subject circuit block and for transmitting the boost voltage thereto, and a boost block selecting circuit provided for the boost voltage transmission line and for supplying thereto the source voltage when a block selecting signal is at a non-selecting level and the boost voltage from the boost voltage generator when the block selecting signal is at a selecting level.

The boost block selecting circuit includes a first transistor, which is turned on in response to the transition of the block selecting signal to the selecting level so as to supply the boost voltage from the boost voltage generator to the boost voltage transmission line, and a second transistor, which is turned on in response to the transition of the block selection signal to the non-selecting level so as to supply the supply voltage from the boost voltage generator to the corresponding boost voltage transmission line.

According to the present invention, there is provided another semiconductor device in which the boost voltage transmission line comprises a first and a second boost voltage transmission line, the boost subject circuit block comprises boost subject circuit blocks corresponding to the first and second boost voltage transmission lines, the boost block selecting circuit comprising, a first transistor, which is turned on in response to the transition of a first block selecting signal corresponding to the first boost voltage transmission line to the selecting level so as to supply the boost voltage from the boost voltage generator to the first boost voltage transmission line, a second transistor, which is turned on in response to the transition of the first block selecting signal to the non-selecting level so as to supply the source voltage to the first boost voltage transmission line, a third transistor, which is turned on in response to the transition of a second block selecting signal, complementary to the first block selecting signal, to the selecting level so as to supply the boost voltage from the boost voltage generator to the second boost voltage transmission line, and a fourth transistor, which is turned on in response to the transition of the second block selecting signal to the non-selecting level so as to supply the source voltage to the second boost voltage transmission line.

Other objects and features of the present invention will clarified from the following description with reference to attached drawings.

PREFERRED EMBODIMENTS OF THE INVENTION

Now preferred embodiments of the present invention will be described.

Figure 1:
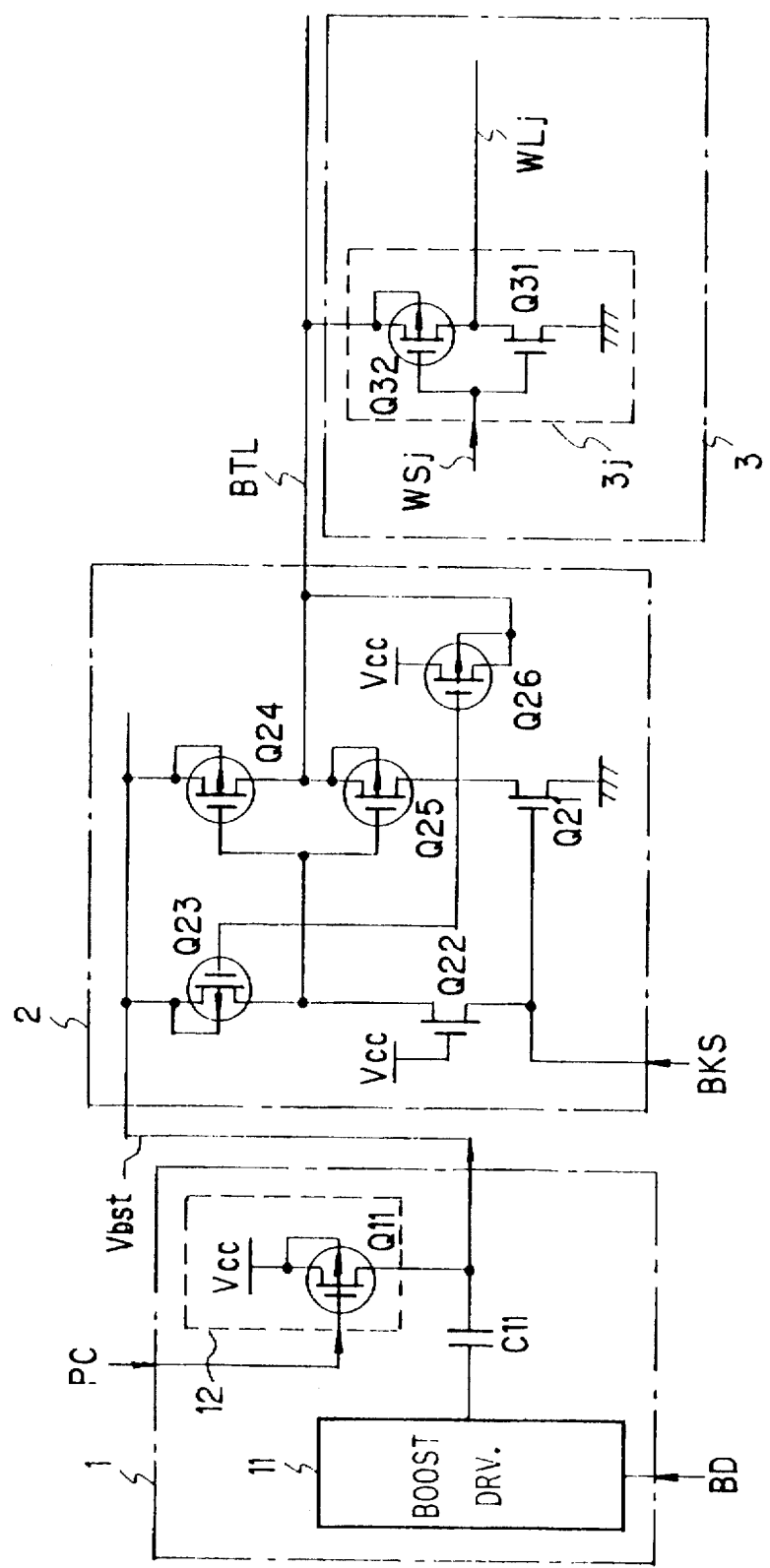
FIG. 1 is a circuit diagram showing the boost block selecting circuit in a first embodiment of the present invention.
Figure 6:
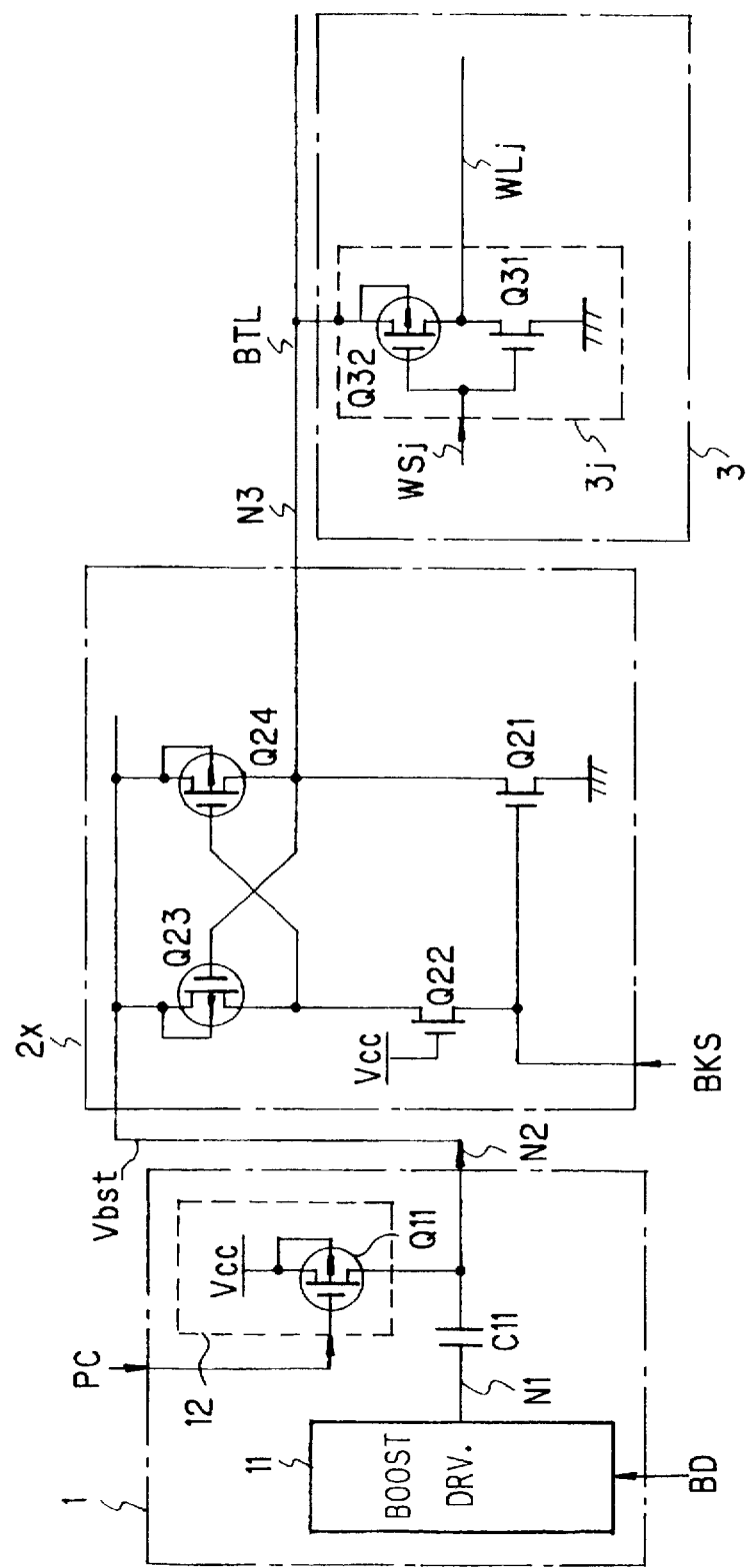
FIG. 6 shows a typical example of semiconductor device with boost voltage supply means.
Figure 7:
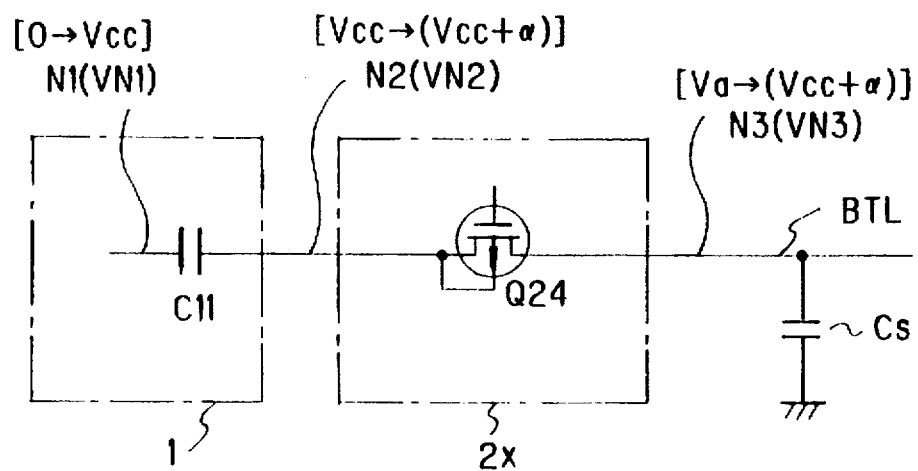
FIG. 7 is an equivalent circuit diagram for explaining boost ratio.

The embodiment shown in FIG. 1 is different from the prior art semiconductor device shown in FIG. 6 in that it comprises, in lieu of the boost block selecting circuit 2x, a boost block selecting circuit 2, which comprises an n-channel transistor Q21 for receiving the block selecting signal BKS at its gate and having its source connected to ground potential, an n-channel transistor Q22 for receiving the source voltage Vcc at its gate and the block selecting signal BKS at the source, a p-channel transistor Q23 for receiving the boost voltage Vbst from the boost voltage generator 1 at its source and substrate and having its drain connected to the drain of the transistor Q22 and its gate to the drain of the transistor Q21, a p-channel transistor Q24 for receiving the boost voltage Vbst at its source and substrate and having its drain connected to the boost voltage transmission line BTL and its gate connected to the drain of the transistor Q22, a p-channel transistor Q25 having its source and substrate connected to the boost voltage transmission line BTL, its gate connected to the drain of the transistor Q22 and its drain connected to the drain of the transistor Q21, and a p-channel transistor Q26 for receiving the source voltage Vcc at its source and having its gate connected to the drain of the transistor Q21 and its drain and substrate connected to the boost voltage transmission line BTL, the transistor Q24 being turned on when the corresponding block selecting signal BKS is brought to a selecting level (i.e., low level), thus causing the boost voltage Vbst from the boost voltage generator 1 to be supplied to the boost voltage transmission line BTL, the transistor Q26 being turned on when the corresponding block selecting signal BKS is brought to the non-selecting level (i.e., high level), thus causing the source voltage Vcc to be supplied to the boost voltage transmission line BTL.

Now the operation of the boost block selecting circuit 2 will be explained. In operation, when the block selecting signal BKS is brought to the non-selecting level, i.e., high level, the transistor Q23 is turned on to transmit the low level to the gates of transistors Q23 and Q26, thus turning on these transistors. Thus, the transistor Q23 is turned on to transmit the source voltage Vcc to the gates of the transistors Q24 and Q25, thus turning on these transistors. In this state, that is, with only the sole transistor Q26 among the transistors Q24, Q25 and Q26 connected to the boost voltage transmission line BTL being "on" while the other transistors are "off", the source voltage Vcc is supplied to the boost voltage transmission line BTL.

When the block selecting signal BKS is brought to the selecting level, i.e., the low level, the transistor Q22 is normally turned on to bring the gate of the transistors Q24 and Q25 to low level. In the meantime, since the transistor Q21 has been "off", the gates of the transistors Q23 and Q26 are brought to the high level, thus turning off these transistors. In this state, the transistors Q24 and Q25 are maintained in "on" state with their gates at low level, and the transistor Q21 connected to the drain of the transistor Q25 is "off".

Thus, the boost voltage Vbst from the boost voltage generator 1 is supplied to the boost voltage transmission line BTL.

Figure 2:
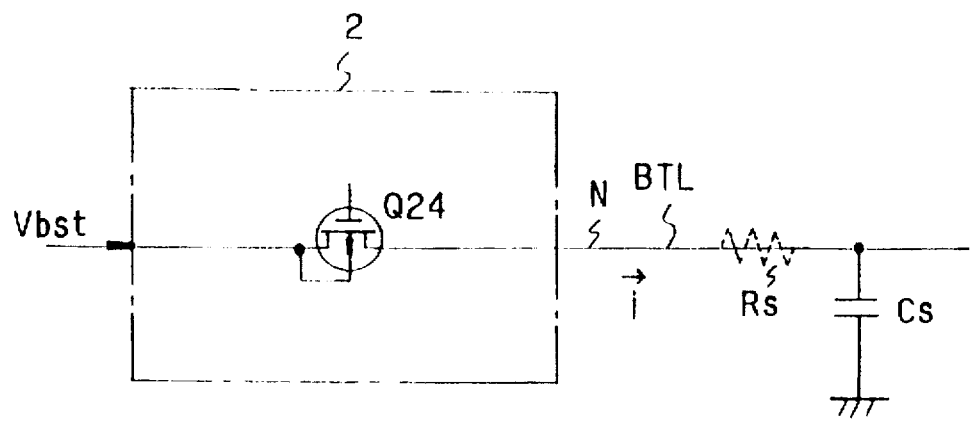
FIG. 2 is an equivalent circuit diagram for obtaining the voltage change on the boost voltage transmission line BTL.
Figure 3:
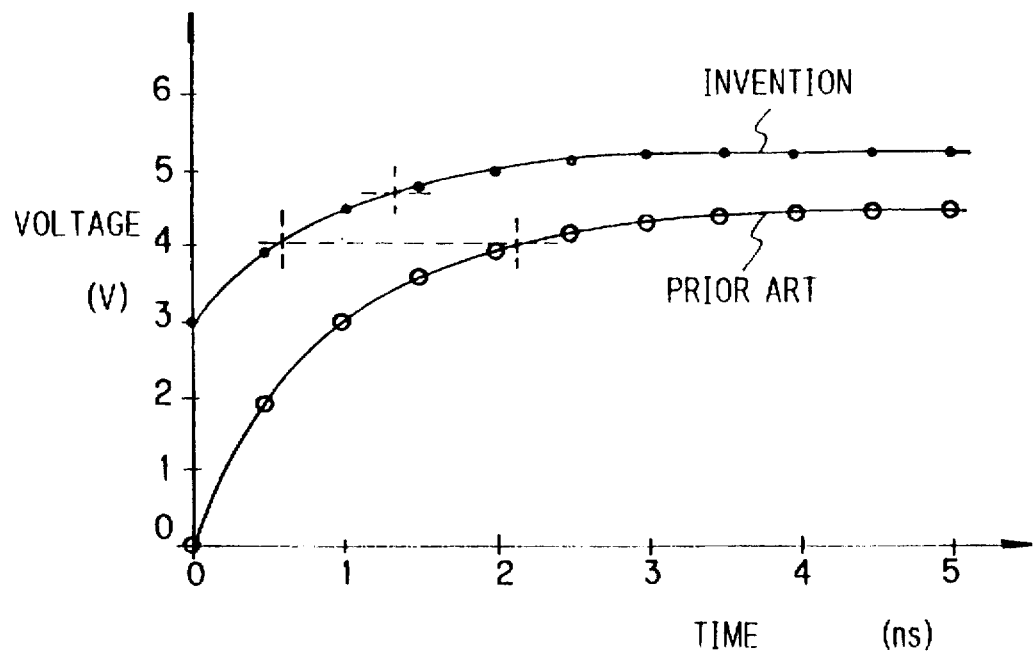
FIG. 3 is a graph showing voltage change in the prior art and the present invention.

The voltage change on the boost voltage transmission line BTL in this embodiment when the block selecting signal BKS is changed from the non-selecting level to the selecting level, will now be described. FIG. 2 is an equivalent circuit diagram for obtaining the voltage change on the boost voltage transmission line BTL. FIG. 3 is a graph showing the voltage change (also showing that in the prior art example).

In the equivalent circuit shown in FIG. 2, labeled Rs is the parasitic resistor of the boost voltage transmission line BTL having resistance R1, and Cs is the parasitic capacitor of the line with capacitance C1. Current i is caused to flow through the boost voltage transmission line BTL is to store change in the parasitic capacitor Cs.

Denoting the voltage on the output terminal of the boost block selecting circuit 2, i.e., the input terminal of the boost voltage transmission line BTL (hereinafter referred to as node N by E1), when the block selecting signal BKS is brought to non-selecting level and voltage on the node N when the block selecting signal BKS is brought to selecting level at instant t=0 by E2 (i.e., boost voltage), the voltage change characteristic at this time may be expressed, using step function u(t), as $$E_1[I-u(t)]+E_2u(t)=R_1i+(1/C_1)\int i dt \qquad (5)$$

Through Laplace transform, $$E_2/s=R_1I(s)+[1/(sC_1)]I(s)+[1/(sC_1)]i^{(-1)}(0) \qquad (6)$$

The initial condition is $$i^{(-1)}(0)=\int_{-\infty}^{0} dq = E_1 C_1 \qquad (7)$$

Hence, $$I(s)(\{R_1+1/sC_1\})=(E_2-E_1)/s \qquad (8)$$

$$I(s)=((E_2-E_1)/R_1)(1/(R_1C_1))) \qquad (9)$$

Through inverse Laplace transform, $$I(t)=((E_2-E_1)/R1)\exp(-t/R_1C_1) \qquad (10)$$

The potential on the node N may be expressed in terms of time t as:

$$E_1+(1/C_1)\int_0^t i dt = E_2+(E_1-E_2)\exp((-t/(C_1R_1)) \qquad (11)$$

The boost ratio and the voltage change on node N (or N3 in FIG. 6) in this embodiment and those in the prior art example will be compared using the equations (4) and (11).

As an example of parameters, according to the present invention $$\begin{aligned} C_{11} &= 90 \text{ pF}, C1 = Cs = 30 \text{ pF}, \\ V_a &= E_1 = Vcc = 3 \text{ V, and} \\ R1 &= 30 \Omega \end{aligned} \qquad (13)$$

In the prior art example, $$\begin{aligned} C11 &= 90 \text{ pF}, C1 = Cs = 30 \text{ pF}, \\ Va &= E1 = 0 \text{ V, and} \\ R1 &= 30 \Omega \end{aligned} \qquad (14)$$

From the equation (4) it will be seen that according to the present invention the boost ratio is 2.25 V, which is far higher than the 1.5 V boost ratio in the prior art example.

The voltage change at node N is as shown in FIG. 3. According to the present invention, the time until 90% of the settled value of boost voltage (which is 5.25 V in the present invention and 4.5 V in the prior art) is reached is about 1.3 ns which is far shorter than the 2.1 ns required in the prior art example. In the present invention, the time until reaching of the same voltage as 90% of the settled voltage in the prior art, is further shorter, i.e. about 0.6 ns. In this case, the amplitude of the potential for charging and discharging the node N at the time of selecting/non-selecting level switching is 2.25 V according to the present invention, and 4.5 V in the prior art. This means that it is possible to obtain a corresponding power consumption reduction in the present invention.

Figure 4:
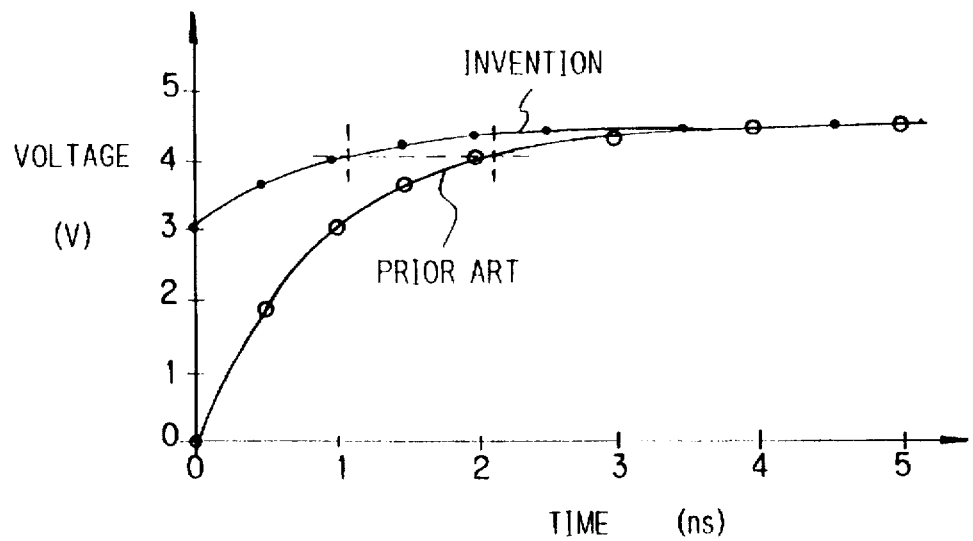
FIG. 4 shows a boost voltage change with the same boost ratio as in the prior art example.

The characteristic of voltage change at node N with the same boost ratio as in the prior art example, will now be obtained. In this case, the capacitance of the boost capacitor C11 is 30 pF, and the voltage characteristic is as shown in FIG. 4. It will be seen that the capacitance of the boost capacitor C11 can be made to be one-third that of the prior art example, thus permitting faster operation and lower power consumption. The time until reaching 90% of the settled value of boost voltage is about 1.1 ns in the present invention compared to 2.1 ns in the prior art example, as noted above. It is thus possible to obtain faster operation. The consumed power reduction that is obtainable also is obvious from the fact that the potential amplitude for charging and discharging the node at the time of selecting/non-selecting level switching is 1.5 V.

In this embodiment, it is possible to provide only one set or a plurality of sets of the boost block selecting circuit 2, boost voltage transmission line BTL and boost subject circuit block 3, and the effects described above are obtainable with each set.

Figure 5:
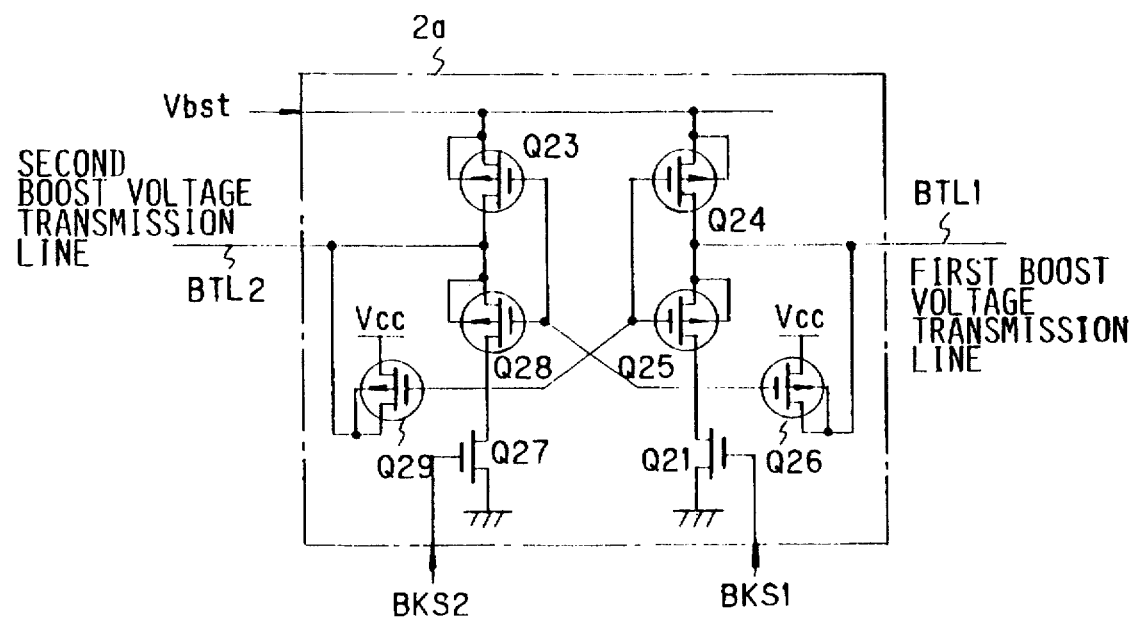
FIG. 5 is a circuit diagram showing the boost block selecting circuit in a second embodiment of the present invention.

FIG. 5 is a circuit diagram showing the boost block selecting circuit in a second embodiment of the present invention.

This embodiment comprises a pair of, i.e., first and second, boost voltage transmission lines BTL1 and BTL2 (corresponding boost subject circuit blocks being, of course, supplied). A boost voltage Vbst, which is controlled for selection by the block selecting signals BKS1 and BKS2 which are in complementary logic level relation to each other, is supplied from a boost block selecting circuit 2a to the first and second boost voltage transmission lines BTL1 and BTL2.

The boost block selecting circuit 2a in this embodiment has a symmetrical circuit structure with respect to the first and second boost voltage transmission lines BTL1 and BTL2. Specifically, the circuit 2a has two, i.e., left and right, symmetrical circuit blocks (for lines BTL2 and BTL1), which are each constituted by a portion of the boost block selecting circuit 2 in the first embodiment including the transistors Q21 and Q24 to Q26, and block selecting signals BKS1 (for right line BTL1) and BKS2 (for left line BTL2) are supplied to the left and right symmetrical circuit blocks.

In operation, when the block selecting signal BKS1 is brought to non-selecting, i.e., high, and BKS2 is brought to selecting, i.e., low, levels, the transistor Q21 is turned on, and the transistor Q27 is turned off. The turning-on of the transistor Q21 brings the gates of the transistors Q26, Q28 and Q23 to low level, thus turning on these transistors. In the meantime, the transistors Q24, Q25 and Q29 are turned off since the boost voltage Vbst supplied through the transistors Q23 and Q28 is present at their gates. Thus, the transistors Q24, Q25 and Q26 which are connected to the boost voltage transmission line BTL1 come into a state such that the transistor Q26 is "on" and the transistors Q24 and Q25 are "off". The source voltage Vcc is thus supplied to the boost voltage transmission line BTL1. On the other hand, the transistors Q23, Q28 and Q29 which are connected to the boost voltage transmission line BTL2 come into a state such that the transistors Q23 and Q28 are "on" and the transistor Q29 is "off". The boost voltage Vbst is thus supplied to the boost voltage transmission line BTL2.

When the block selecting signals BKS1 and BKS2 are brought to selecting, i.e., low level and non-selecting i.e., high level, respectively, the transistors come up with the opposite state to the above state, and thus the boost voltage Vbst and source voltage Vcc are supplied to the first and second boost voltage transmission lines BTL1 and BTL2, respectively.

In this embodiment, in addition to obtaining the same effects as the first embodiment, the boost voltage Vbst and source voltage Vcc can be selectively supplied to the two, i.e., first and second boost voltage transmission lines BTL1 and BTL2 (and hence the two boost subject circuit blocks) from single boost block selecting circuit 2a. It is thus possible to reduce the number of circuit elements compared to the first embodiment, in which two boost block selecting circuits 2 are supplied. That is, the number of circuit elements, which is 6×2=12 in the first embodiment, is reduced to eight in the second embodiment.

As has been described in the foregoing, according to the present invention the boost block selecting circuit is adapted to supply the source voltage to the pertinent boost voltage transmission line when the block selecting signal is at the non-selecting level and supply the boost voltage from the boost voltage generator when the block selecting signal is at the selecting level. It is thus possible to increase the boost ratio compared to the prior art. In addition, the potential amplitude for charging and discharging the boost voltage transmission line at the time of the selecting/non-selecting level switching is small, thus permitting corresponding consumed power reduction and operation speed increase. A further advantage is that with the same boost ratio as in the prior art example, the capacitance of the boost capacitor in the boost voltage generator can be reduced to obtain further consumed power reduction and operation speed increase. More specifically, in the present invention, a boost subject circuit block supplies a supply voltage (which has been ground level in the prior art) to a corresponding boost voltage transmission line in response to the transition of a block selecting signal to non-selecting level, while supplying a boost voltage from a boost voltage generator in response to the transition of the block selecting signal to selecting level. According to the present invention a large boost ratio is obtainable. In addition, the potential amplitude of charging and discharging the boost voltage transmission line at the time of selecting/non-selecting level switching is small, thus permitting corresponding consumed power reduction and operation speed increase.

Changes in construction will be apparent to those skilled in the art and various modifications and embodiments may be made without departing from the scope of the invention. The matter set forth in the foregoing description and accompanying drawings is offered by way of illustration only. It is therefore intended that the foregoing description be regarded as illustrative rather than limiting.

What is claimed is:

1. A semiconductor device comprising:

a boost voltage generator for generating a boost voltage higher than a positive non-ground potential source voltage at a predetermined timing, a boost subject circuit block for supplying the boost voltage from the boost voltage generator to a predetermined internal circuit at a predetermined timing, at least one boost voltage transmission line provided for the boost subject circuit block and for transmitting the boost voltage thereto, and a boost block selecting circuit provided for the boost voltage transmission line and for supplying thereto the source voltage when a block selecting signal is at a non-selecting level and for supplying the boost voltage from the boost voltage generator when the block selecting signal is at a selecting level.

2. The semiconductor device according to claim 1, wherein the boost block selecting circuit includes a first transistor, which is turned on in response to transition of the block selecting signal to the selecting level so as to supply the boost voltage from the boost voltage generator to the boost voltage transmission line, and a second transistor, which is turned on in response to transition of the block selection signal to the non-selecting level so as to supply the source voltage from the boost voltage generator to the boost voltage transmission line.

3. A semiconductor device comprising:

a boost voltage generator for generating a boost voltage higher than a non-ground potential source voltage at a predetermined timing, a boost subject circuit block for supplying the boost voltage from the boost voltage generator to a predetermined internal circuit at a predetermined timing, a first and a second boost voltage transmission line provided for the boost subject circuit block and for transmitting the boost voltage thereto, the boost subject circuit block comprising boost subject circuit blocks corresponding to the first and second boost voltage transmission lines, the boost block selecting circuit comprising, a first transistor, which is turned on in response to transition of a first block selecting signal corresponding to the first boost voltage transmission line to the selecting level so as to supply the boost voltage from the boost voltage generator to the boost voltage transmission line, a second transistor, which is turned on in response to transition of the first block selecting signal to the non-selecting level so as to supply the source voltage to the first boost voltage transmission line, a third transistor, which is turned on in response to transition of a second block selecting signal, complementary to the first block selecting signal, to the selecting level so as to supply the boost voltage from the boost voltage generator to the second boost voltage transmission line, and a fourth transistor, which is turned on in response to transition of the second block selecting signal to the non-selecting level so as to supply the source voltage to the second boost voltage transmission line, and a boost block selecting circuit provided for the boost voltage transmission line and for supplying thereto the source voltage when a block selecting signal is at a non-selecting level and for supplying the boost voltage from the boost voltage generator when the block selecting signal is at a selecting level.

* * * * *